US009285647B2

(12) United States Patent
Chen et al.

(10) Patent No.: US 9,285,647 B2
(45) Date of Patent: Mar. 15, 2016

(54) TFT ARRAY SUBSTRATE, E-PAPER DISPLAY PANEL AND METHOD FOR MANUFACTURING THE SAME

(71) Applicant: Shanghai Tianma Micro-Electronics Co., Ltd., Shanghai (CN)

(72) Inventors: Hao Chen, Shanghai (CN); Tianyi Wu, Shanghai (CN); Jun Ma, Shanghai (CN); Yong Wu, Shanghai (CN); Huiping Chai, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/927,006

(22) Filed: Jun. 25, 2013

(65) Prior Publication Data

US 2013/0286465 A1    Oct. 31, 2013

Related U.S. Application Data

(63) Continuation of application No. PCT/CN2012/078230, filed on Jul. 5, 2012.

(30) Foreign Application Priority Data

Oct. 20, 2011  (CN) .......................... 2011 1 0321307

(51) Int. Cl.
*G02F 1/167* (2006.01)
*H01L 27/12* (2006.01)
*H01L 27/15* (2006.01)

(52) U.S. Cl.
CPC ............ *G02F 1/167* (2013.01); *H01L 27/1255* (2013.01); *H01L 27/156* (2013.01); *G02F 2001/1676* (2013.01)

(58) Field of Classification Search
CPC .... G02F 1/167; G02F 1/1368; H01L 33/0079; H01L 27/1225; H01L 27/3251; H01L 27/156; H01L 27/3248; H01L 27/3262
USPC .......... 359/296, 242, 290; 345/107, 105, 214; 438/29
See application file for complete search history.

(56) References Cited

U.S. PATENT DOCUMENTS 7,177,067 B1 *   2/2007   Sakamoto ..................... 359/296
7,196,353 B2 *   3/2007   Murade .......................... 257/59
(Continued)

FOREIGN PATENT DOCUMENTS

CN      1534367 A      10/2004
CN      1683973 A      10/2005
(Continued)

OTHER PUBLICATIONS

2nd Office Action as issued in corresponding Chinese Application 201110321307.8, dated Jul. 28, 2015, and accompanying English translation.
(Continued)

*Primary Examiner* — Ricky Mack
*Assistant Examiner* — Daniele Manikeu
(74) *Attorney, Agent, or Firm* — Alston & Bird LLP

(57) ABSTRACT

A TFT array substrate, an electronic paper display panel and method for manufacturing the same are disclosed. The electronic paper display panel includes: a first transparent substrate, and an array of storage capacitors located on an inner side of the first transparent substrate. Each of the storage capacitors includes a common electrode located on the first transparent substrate, a transparent capacitor medium layer located on the common electrode, and a pixel electrode (44) located on the transparent capacitor medium layer. The display panel also includes an electronic paper film located on the TFT array substrate, a transparent electrode located on the electronic paper film, and a second transparent substrate located on the transparent electrode. A double-sided display may be realized by the electronic paper display panel.

19 Claims, 8 Drawing Sheets

(56) References Cited

U.S. PATENT DOCUMENTS

| | | | |
|---|---|---|---|
| 2003/0063244 A1* | 4/2003 | Fujimori et al. | 349/113 |
| 2003/0076573 A1* | 4/2003 | Gates et al. | 359/245 |
| 2003/0214567 A1* | 11/2003 | Kanazawa et al. | 347/112 |
| 2004/0252076 A1 | 12/2004 | Kodama | |
| 2006/0076560 A1* | 4/2006 | Eguchi et al. | 257/59 |
| 2006/0114393 A1* | 6/2006 | Sawasaki et al. | 349/138 |
| 2007/0041169 A1 | 2/2007 | Konet et al. | |
| 2007/0200795 A1* | 8/2007 | Whitesides et al. | 345/55 |
| 2008/0186259 A1* | 8/2008 | Todorokihara | G02F 1/167 345/76 |
| 2009/0009465 A1* | 1/2009 | Choi | G06F 3/0412 345/107 |
| 2010/0039354 A1 | 2/2010 | Sakamoto | |
| 2010/0073279 A1* | 3/2010 | Kwon et al. | 345/107 |
| 2011/0032223 A1* | 2/2011 | Okamoto et al. | 345/204 |
| 2011/0141550 A1* | 6/2011 | Ishida | G02F 1/136204 359/296 |

FOREIGN PATENT DOCUMENTS

| | | |
|---|---|---|
| CN | 100422837 C | 10/2008 |
| CN | 101308818 A | 11/2008 |
| CN | 101329487 A | 12/2008 |
| CN | 101446705 A | 6/2009 |
| CN | 101655646 A | 2/2010 |
| CN | 101762923 A | 6/2010 |
| CN | 101794050 A | 8/2010 |
| CN | 101989015 A | 3/2011 |
| CN | 102237411 A | 11/2011 |

OTHER PUBLICATIONS

Third Office Action as issued in corresponding Chinese Application No. 201110321307.8, dated Jan. 13, 2016.

* cited by examiner

TFT ARRAY SUBSTRATE, E-PAPER DISPLAY PANEL AND METHOD FOR MANUFACTURING THE SAME

CROSS-REFERENCES TO RELATED APPLICATIONS

This application claims priority to and is a continuation of International Patent Application PCT/CN2012/078230, titled "TFT ARRAY SUBSTRATE, E-PAPER DISPLAY PANEL AND METHOD FOR MANUFACTURING THE SAME", filed on Jul. 5, 2012, which claims priority to Chinese patent application No. 201110321307.8 titled "TFT ARRAY SUBSTRATE, E-PAPER DISPLAY PANEL AND METHOD FOR MANUFACTURING THE SAME" and filed on Oct. 20, 2011 with the State Intellectual Property Office of PRC, the contents of which are incorporated herein by reference in their entirety.

FIELD OF THE INVENTION

The present invention relates generally to the field of display technique, and in particular to a TFT (Thin-Film Transistor) array substrate, electronic paper display panel and method for manufacturing the same.

BACKGROUND OF THE INVENTION

E-paper (electronic paper) is now more and more popular because of its lower energy consumption, paper-like soft display behavior and thus of substituting for paper. Due to its excellent image keeping characteristic, E-paper is especially suitable for static display products for text reading and the like.

A fundamental principle of the E-paper is that charged particles in an electrophoretic fluid may reflect ambient light and then display an image which is received by human eyes. In an image converting phase, positions of the charged particles in the electrophoretic fluid may be controlled by a power-up voltage across the electrophoretic fluid and duration of the power-up voltage. Therefore the strength of the reflected light is controlled to achieve a gray-scale display. In an image keeping phase, the positions of the charged particles in the electrophoretic fluids are kept for the equal potential over both ends of the electrophoretic fluid, thus a static image display with lower energy consumption can be achieved.

When a user is reading, E-paper consumes electrical energy only if the user refreshes a page, otherwise, E-paper can display continuously even if its power is turned off. Therefore, E-paper displays with lower power consumption. Moreover, E-paper has a characteristic of high reflection in which the E-paper displays without backlight and achieves a black-and-white display or a color display by reflection of ambient light. Unlike a currently used transparent display LCD (Liquid Crystal Display), the E-paper, which displays by means of reflection, has good display properties even when used in a very bright environment.

E-paper displays include color displays and black-and-white displays. FIG. 1 is a schematic cross-sectional diagram of an E-paper for black-and-white display in the related art. Referring to FIG. 1, the E-paper for black-and-white display includes a TFT (Thin-Film Transistor) array substrate 10 and a display substrate 20. The TFT array substrate 10 includes a glass substrate 11 and storage capacitors formed on the glass substrate 11, where each of the storage capacitors consists of a common electrode 12, a capacitor medium layer 13 and a pixel electrode 14. Material of the common electrode 12 is an opaque metal and material of the pixel electrode 14 is transparent ITO (Indium Tin Oxides). The display substrate 20 includes an E-paper film 21 and a PET (Polyethylene terephthalate) substrate 23 combined with the E-paper film 21, where the PET substrate 23 is provided thereon with a transparent electrode 22, and PET, namely Polyethylene terephthalate, is a main type of thermoplastic polyester. In the related art, it is common to employ the microcapsule paper film in which there are negatively charged black particles and positive charged white particles. A main principle of the black-and-white display is that: a reference voltage is applied to the transparent electrode 22, corresponding pixel voltages are applied to respective ones of the pixel electrodes 14 via a data line, and the potential differences of pixels, which are the potential differences between the pixel electrodes 14 and the transparent electrode 22, are controlled to implement the control to the moving direction of the negatively charged black particles and the positively charged white particles in the pixel area. Since the white particles reflect light and the black particles absorb light, when the positively charged white particles gather at the side close to the PET substrate 23, white is displayed at the place where the white particles gather; and when the negatively charged black particles gather to the side close to the PET substrate 23, black is displayed at the place where the black particles gather.

To obtain an E-paper for color display, a color filter (CF) plate is added to the E-paper for black-and-white display. Currently, a color E-paper display panel mainly contains three parts: a TFT array substrate, a CF plate and a display substrate consisting of a PET substrate and an E-paper film. FIG. 2 is a schematic cross-sectional diagram of a color E-paper in the related art. A display substrate 20 is located on a TFT array substrate 10 and a CF plate 30 is located on the display substrate 20. The principle of the color E-paper is that: after passing through the CF plate 30, the light reflected by the white particles present a color image.

However, for the color E-paper in the related art, the CF plate 30 is needed for the purpose of color display. The presence of the CF plate leads to an increase in thickness of the E-paper, and only the color display rather than both the color display and the black and white display can be achieved.

BRIEF SUMMARY OF THE INVENTION

One implementation is a Thin-Film Transistor array substrate including a first transparent substrate, and an array of storage capacitors located on the first transparent substrate. Each of the storage capacitors includes a common electrode located on the first transparent substrate, a transparent capacitor medium layer located on the common electrode, and a pixel electrode located on the transparent capacitor medium layer, and the common electrodes and the pixel electrodes include a transparent conductive material.

Another implementation is an electronic paper display panel including the TFT array substrate, an electronic paper film, located on the Thin-Film Transistor array substrate, a transparent electrode, located on the electronic paper film, and a second transparent substrate, located on the transparent electrode.

Another implementation is a method for manufacturing an electronic paper display panel. The method includes providing a Thin-Film Transistor array substrate, providing an electronic paper film and adhering the electronic paper film on the Thin-Film Transistor array substrate. The method also includes providing a second transparent substrate, on which a transparent electrode is deposited, and adhering the second transparent substrate on the electronic paper film such that the transparent electrode faces towards the electronic paper film.

Another implementation is a method for manufacturing an electronic paper display panel. The method includes providing a Thin-Film Transistor array substrate, providing a second transparent substrate, on which a transparent electrode is deposited, providing an electronic paper film and adhering the electronic paper film on the transparent electrode, and adhering the second transparent substrate on the Thin-Film Transistor array substrate such that the electronic paper film faces towards the Thin-Film Transistor array substrate.

DETAILED DESCRIPTION OF THE INVENTION

To describe certain objects, features and advantages of the present invention, specific embodiments are described with reference to the drawings.

Certain specific details are set forth in the following descriptions for sufficient understanding of the invention. However, the invention can also be implemented in other ways, which are different from the specific details described herein, and similar variations can be made by those skilled in the art without departing from the spirit of the invention. Therefore, the invention is not limited to specific embodiments disclosed hereinafter.

Before the electronic paper display panels according to the specific embodiments of the present invention are described in detail, it firstly should be noted that, a first transparent substrate has two sides with one side facing to electronic paper film and the other side opposite to the electronic paper film. In the discussed embodiments, the inner side of the first transparent substrate refers to the side facing to the electronic paper film and the outer side of the first transparent substrate refers to the side opposite to the electronic paper film. A second transparent substrate has two sides with one side facing to a TFT array substrate and the other side opposite to the TFT array substrate, the inner side of the second transparent substrate refers to the side facing to the TFT array substrate and the outer side of the second transparent substrate refers to the side opposite to the TFT array substrate.

A First Embodiment

Figure 1:
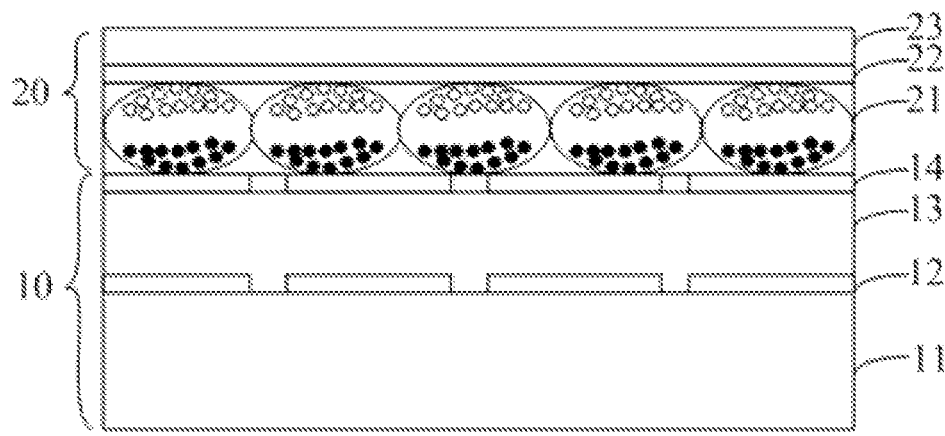
FIG. 1 is a schematic cross-sectional diagram of an electronic paper display panel for black-and-white display, as known in the related art.
Figure 2:
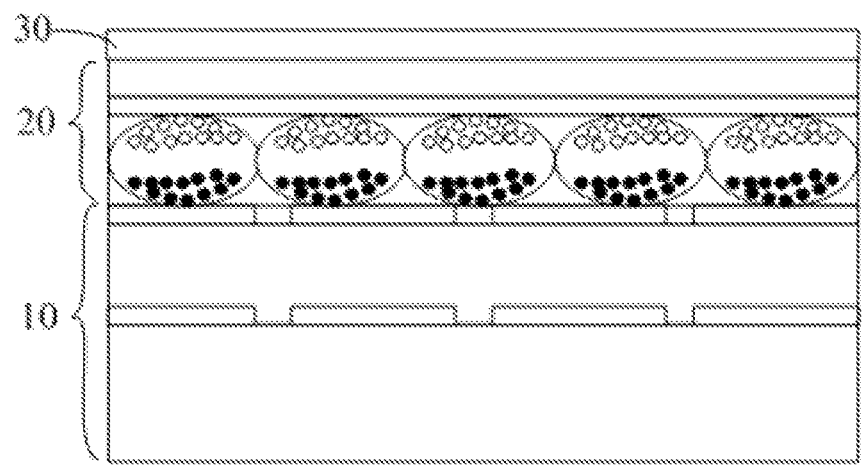
FIG. 2 is a schematic cross-sectional diagram of an electronic paper display panel for color display, as known in the related art.
Figure 3:
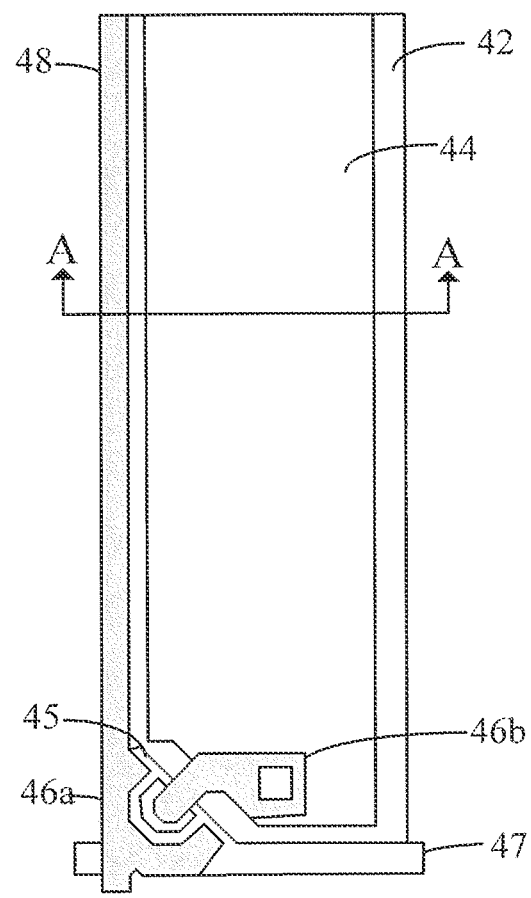
FIG. 3 is a schematic structural diagram of a pixel in an electronic paper display panel according to some embodiments of the present invention.
Figure 4:
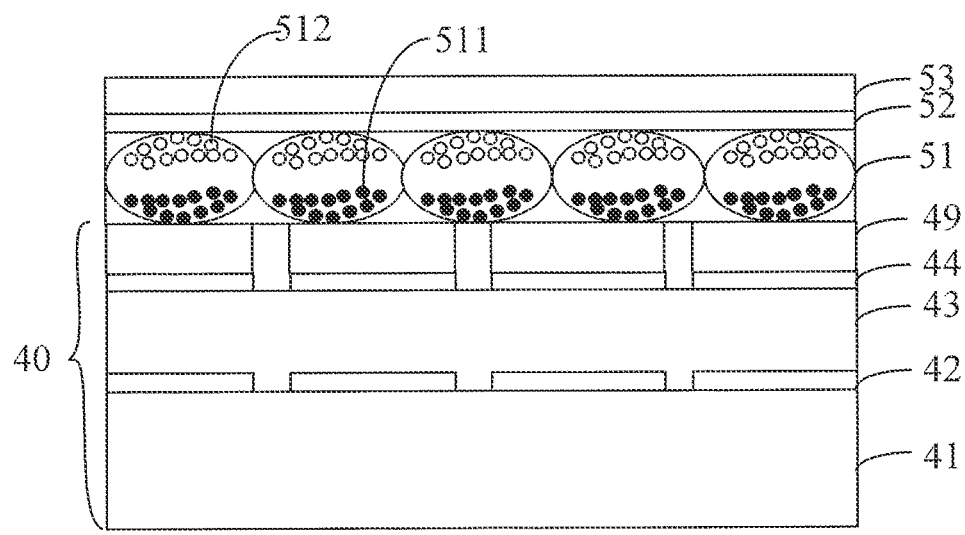
FIG. 4 is a schematic cross-sectional diagram showing a pixel area in an electronic paper display panel according to a first specific embodiment of the present invention taken along an A-A direction illustrated in FIG. 3.

FIG. 3 is a schematic structural diagram of a pixel in an electronic paper display panel according to a first specific embodiment. FIG. 4 is a schematic cross-sectional diagram of a pixel area in an electronic paper display panel according to a first specific embodiment taken along an A-A direction illustrated in FIG. 3.

Referring to FIG. 3 and FIG. 4, the electronic paper display panel will includes: a TFT array substrate 40 including a first transparent substrate 41 and an array of storage capacitors, in which each of the storage capacitors includes a common electrode 42 located on the inner side of the first transparent substrate 41, a transparent capacitor medium layer 43 located on the common electrode 42 and a pixel electrode 44 located on the transparent capacitor medium layer 43, and the common electrodes 42 and the pixel electrodes 44 are made of transparent conductive materials. The electronic paper display panel further includes an electronic paper film 51 located on the TFT array substrate 40, a transparent electrode 52 located on the electronic paper film 51 and a second transparent substrate 53 located on the transparent electrode 52. In the first embodiment, the TFT array substrate 40 further includes a color filtering layer 49, located on the pixel electrodes 44, that is, between the pixel electrodes 44 and the electronic paper film 51.

The principle for the displaying of the electronic paper display panel according to the embodiment is that: when a user watches from the side of the TFT array substrate 40, light passes through the first transparent substrate 41, the array of the storage capacitors and the color filtering layer 49, then passes through the color filtering layer 49 again after being reflected by the white particles 512 in the electronic paper film 51 and is transmitted through the TFT array substrate 40, thus a color display is realized on the side of the TFT array substrate 40. In addition, when the user watches from the side of the second transparent substrate 53 in the electronic paper display panel, the light passes through the second transparent substrate 53, encounters the white particles 512 in the electronic paper film and then pass through the second transparent substrate 53 again after being reflected by the white particles 512. Thus, a black-and-white display is realized on the side of the second transparent substrate 53.

An advantage of the electronic paper display panel in the embodiment is that a double-sided display is provided. A color display for using when the user needs to watch color images is provided on one side, and a black-and-white display which may be selected and used when the user only needs to read articles is provide on the other side. One function of the electronic paper display panel provides a paper-like soft display effect. This occurs in the black-and-white display at least because light does not travel through the color filtering layer 49. Thus, a loss of light is reduced, and brightness and good black-and-white contrast for display is ensured.

The electronic paper display panel may achieve the double-sided display of the electronic paper display panel due to the transparent conductive materials of the common electrodes and the pixel electrodes. Moreover, in the first embodiment, since there is the color filtering layer 49 formed between the pixel electrodes 44 and the electronic paper film 51, the color display may be realized on the side of the TFT array substrate in the electronic paper display panel, and the black-and-white display may be realized on the side of the second transparent substrate in the electronic paper display panel. In some embodiments, there is no color filtering layer 49, and the black-and-white display is realized on both sides of the electronic paper display panel.

In the present invention, the color filtering layer 49 may be a color resist layer or a CF plate. In the case that the color filtering layer 49 is a color resist layer, the color resist layer includes an R (Red) color resist, a G (Green) color resist and a B (Blue) color resist. Light becomes R light after transmitting through the R color resist, becomes G light after transmitting through the G color resist and becomes B light after transmitting through the B color resist. In this embodiment, the R color resist, G color resist and B color resist are all deposited directly on the TFT array substrate. In the case that the color display is realized by utilizing a CF plate, the CF plate may be aligned with the TFT array substrate and then adhered on the TFT array substrate. In the first embodiment illustrated in FIG. 4, there is a gap between adjacent color resists in the color resist layer and a black matrix (BM) may be formed in the gap. In some embodiments, there is no gap between adjacent color resists, that is, adjacent color resists contact each other. In the case of the CF plate, the CF plate may be an RGB CF plate and the light transmitting from the RGB CF plate are three-color lights of R, G and B.

In some embodiments, the color filtering layer 49 is a color resist layer. Since the color filtering layer 49 is directly deposited on the TFT array substrate, the CF plate may be omitted, and the thickness, weight and cost of the electronic paper display panel are reduced.

In addition, if the color filtering layer is a CF plate, when the CF plate is adhered to the TFT array substrate during the manufacture of the electronic paper display panel, a fine alignment in pixel level is used to align an R color filtering area with an R pixel area, a G color filtering area with a G pixel area and a B color filtering area with a B pixel area. A small deviation in the alignment may result in a misalignment of the CF plate and the TFT array substrate. If the color resist layer is employed as the color filtering layer 49, the color resist layer may be formed on the TFT array substrate by coating, and then the color resists may be formed by exposing and developing. Since the exposing and the developing are in pixel level, it is easier to realize the fine alignment of the color resist layer with the TFT array substrate and the misalignment is avoided. Therefore, forming the color filtering layer by depositing the color resist layer on the TFT array substrate directly may reduce the difficulty of the process.

In the first embodiment, the first transparent substrate 41 is a glass substrate. However, the first transparent substrate 41 in the present invention is not limited to the glass substrate and may also be a transparent substrate of other materials.

In the first embodiment, the materials of the common electrodes 42 and the pixel electrodes 44 are ITO. However, the materials of the common electrode 42 and the pixel electrode 44 are not limited to ITO and may also be other transparent conductive materials.

In the first embodiment, the multiple common electrodes 42 are arranged in array. Since each of the common electrodes 42 has a same electric potential, the common electrodes 42 may also be a single common electrode as a whole surface and each pixel shares the single common electrode rather than one pixel corresponding to one common electrode.

In the first embodiment, the second transparent substrate 53 is a PET substrate, a glass substrate or a plastic substrate. However, the second transparent substrate 53 is not limited to the PET substrate, glass substrate or plastic substrate and may also be a transparent substrate of other materials.

In the first embodiment, the electronic paper film 51 is a microcapsule film including multiple microcapsules. Each of the microcapsules includes black particles 511, white particles 512 and a transparent liquid. Alternatively, each of the microcapsules may also include white particles and a black opaque liquid. Alternatively, each of the microcapsules may include black particles and a white opaque liquid. However, in the present invention, the electronic paper film 51 is not limited to the microcapsule film and may also be other electronic paper film which may be applied in the present invention.

In the first embodiment, the material of the transparent electrode 52 is also ITO. However, the material of the transparent electrode 52 is not limited to ITO and may be other transparent conductive materials. And the transparent electrode 52 is a single electrode as a whole surface.

In the first embodiment, referring to FIG. 3 and FIG. 4, the TFT array substrate 40 in the electronic paper display panel further includes an array of TFT switches, each storage capacitor is electrically connected with a corresponding TFT switch, and the TFT switches and the storage capacitors are arranged on the first transparent substrate 41 in a direction parallel to the transparent substrate. Referring to FIG. 3, the TFT switch includes a source electrode 46a, a drain electrode 46b, a gate electrode 45, a channel region (not illustrated) between the source electrode 46a and the drain electrode 46b, a data line 48 connected with the source electrode 46a and a scan line 47 connected with the gate electrode 45, where the drain electrode 46b is electrically connected with the pixel electrode 44. A voltage is applied on the gate electrode 45 through the scan line 47. After the channel region is turned on, a voltage applied on the data line 48 is transferred to the drain electrode 46b through the source electrode 46a, and is applied on the pixel electrode 44, so that the pixel electrode has the voltage.

Figure 5:
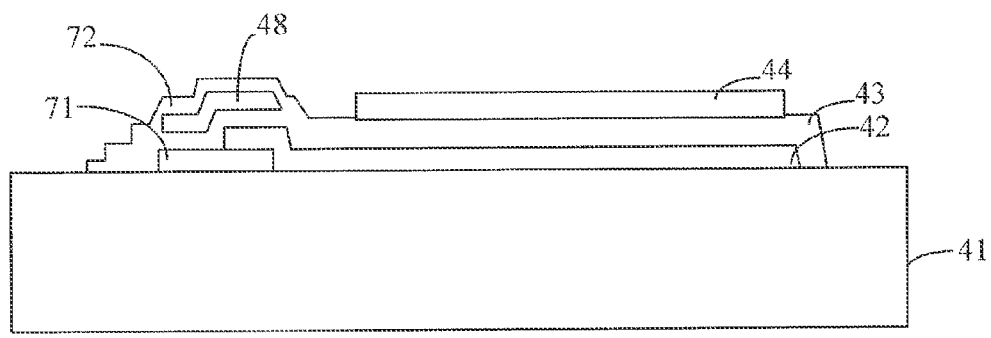
FIG. 5 is a schematic cross-sectional diagram of an TFT array substrate in an electronic paper display panel according to a first specific embodiment taken along the A-A direction illustrated in FIG. 3.

FIG. 5 is a schematic cross-sectional diagram of a TFT array substrate in an electronic paper display panel according to a first specific embodiment taken along an A-A direction illustrated in FIG. 3. Referring to FIG. 3 and FIG. 5, in the embodiment, from the first transparent substrate 41, there are sequentially a common line 71 for providing a voltage to the common electrode 42, the common electrode 42, the data line 48, an insulating layer 72 of which the material may be, for example, SiNx, where a portion of the insulating layer between the common electrode 42 and the pixel electrode 44 serves as a capacitor medium layer 43, and the pixel electrode 44. In the embodiment, the common line 71 may be, for example, metal wiring.

A Second Embodiment

Figure 6:
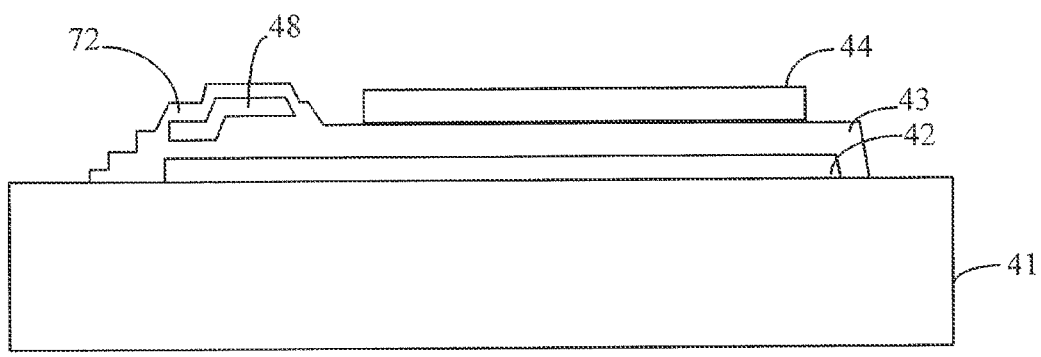
FIG. 6 is a schematic cross-sectional diagram of an TFT array substrate in an electronic paper display panel according to a second embodiment of the present invention taken along the A-A direction illustrated in FIG. 3.

FIG. 6 is a schematic cross-sectional diagram of a TFT array substrate in an electronic paper display panel according to a second specific embodiment taken along an A-A direction illustrated in FIG. 3. In contrast to the embodiment illustrated in FIG. 5, in this embodiment, ITO is used to form the common line/common electrode 42. In this way, the contrast may be sacrificed to a certain extent, but the aperture ratio may be improved. As shown, there are the common electrode 42, the data line 48, the insulating layer 72 of which the material may be, for example, SiNx, where a portion of the insulating layer between the common electrode 42 and the pixel electrode 44 serves as the capacitor medium layer 43, and the pixel electrode 44. Other structures according to the second embodiment may be the same as those of the first embodiment and will not be described in detail herein.

A Third Embodiment

Figure 7:
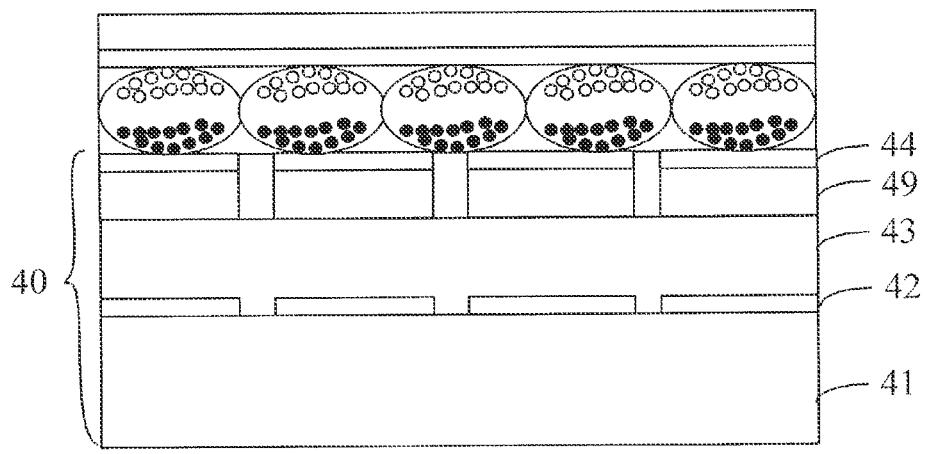
FIG. 7 is a schematic cross-sectional diagram of a pixel area in an electronic paper display panel according to a third embodiment of the present invention.

FIG. 7 is a schematic cross-sectional diagram of a pixel area in an electronic paper display panel according to a third specific embodiment. Referring to FIG. 7, the color filtering layer 49 is located on the transparent capacitor medium layer 43 and the pixel electrodes 44 are located on the color filtering layer 49. That is, positions of the pixel electrodes 44 and the color filtering layer 49 are interchanged as compared with that of the first embodiment. Other structures are the same as that of the first embodiment and will not be described herein.

A Fourth Embodiment

Figure 8:
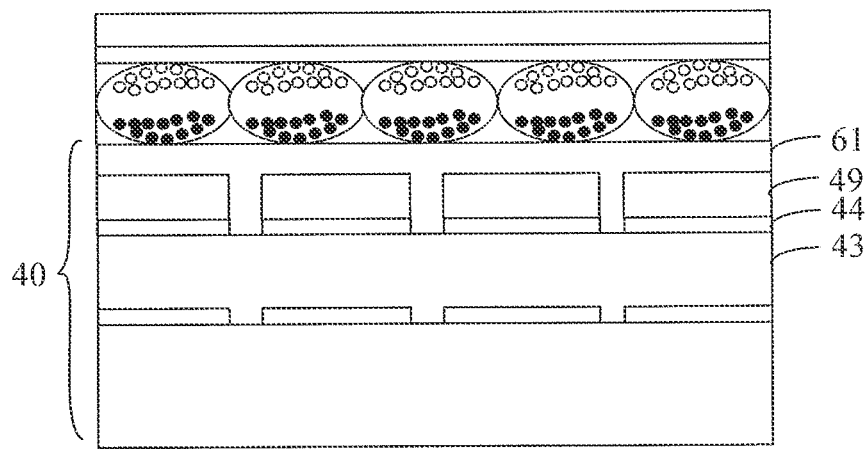
FIG. 8 is a schematic cross-sectional diagram of a pixel area of an electronic paper display panel according to a fourth embodiment of the present invention.

FIG. 8 is a schematic cross-sectional diagram of a pixel area of an electronic paper display panel according to a fourth specific embodiment. Referring to FIG. 8, the color filtering layer 49 is a color resist layer, the pixel electrodes 44 are located on the transparent capacitor medium layer 43, and the color filtering layer 49 is located on the pixel electrodes 44 The TFT array substrate 40 further includes a planar layer 61 covering the pixel electrodes 44 and the color filtering layer 49, and the material of the planar layer 61 is organic film. The planar layer 61 has a substantially planar surface. In other words, a planarization process is performed on the planar layer 61 to flatten the surface of the planar layer 61 after the planar layer 61 is formed. A purpose of forming the planar layer by coating is to flatten the topological inconsistencies formed by the color filtering layer and the TFT array. When the color filtering layer 49 is the color resist layer and no planarization process is performed in forming the color resist layer, it is possible that the surface of the TFT array substrate is not flattened and the adhesion of the TFT array substrate to the electronic paper film is poor. Therefore, forming the planar layer 61 in the embodiment may facilitate the surface flattening of the TFT array substrate 40. Other structures may be the same as that in the first embodiment and will not be described herein.

A Fifth Embodiment

Figure 9:
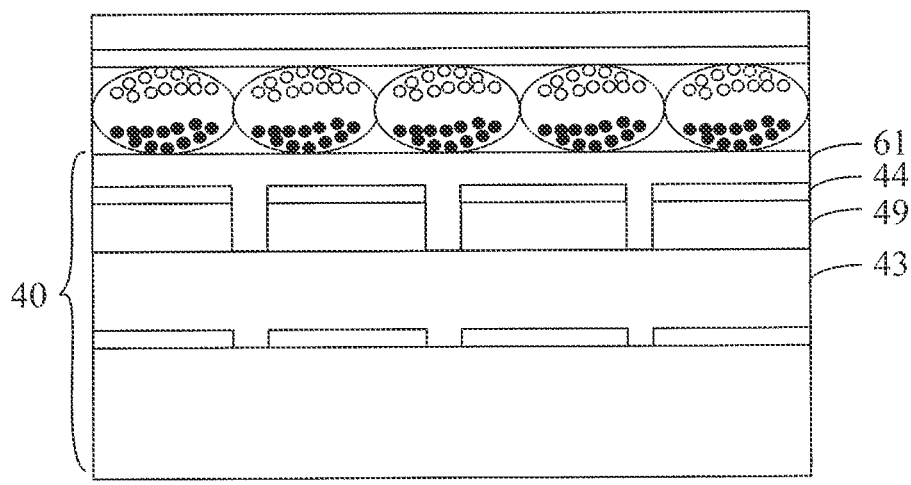
FIG. 9 is a schematic cross-sectional diagram of a pixel area of an electronic paper display panel according to a fifth embodiment of the present invention.

FIG. 9 is a schematic cross-sectional diagram of a pixel area of an electronic paper display panel according to a fifth specific embodiment. The color filtering layer 49, which is a color resist layer, is located on the capacitor medium layer 43, and the pixel electrodes 44 are located on the color filtering layer 49. The TFT array substrate 40 further includes the planar layer 61 covering the pixel electrodes 44 and the color filtering layer 49. The planar layer 61 has a planar surface. In other words, a planarization process is performed on the planar layer 61 to flatten the surface of the planar layer 61 after the planar layer 61 is formed by depositing. The function of the planar layer is the same as that in the fourth embodiment and will not be described herein.

A Sixth Embodiment

Figure 10:
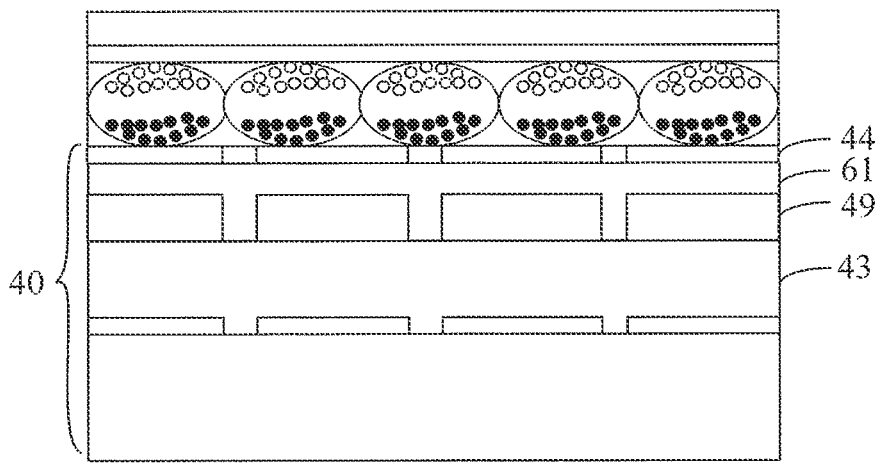
FIG. 10 is a schematic cross-sectional diagram of a pixel area of an electronic paper display panel according to a sixth embodiment of the present invention.

FIG. 10 is a schematic cross-sectional diagram of a pixel area of an electronic paper display panel according to a sixth specific embodiment. Referring to FIG. 10, the color filtering layer 49 is a color resist layer, and the TFT array substrate 40 further includes the planar layer 61. The color filtering layer 49 is located on the transparent capacitor medium layer 43, the planar layer 61 covers the color filtering layer 49, and the pixel electrodes 44 are located on the planar layer 61. The planar layer 61 has a planar surface. In other words, a planarization process is performed on the planar layer 61 to flatten the surface of the planar layer 61 after the planar layer 61 is formed by depositing. The function of the planar layer is the same as that in the fourth embodiment and will not be described herein.

A Seventh Embodiment

Figure 11:
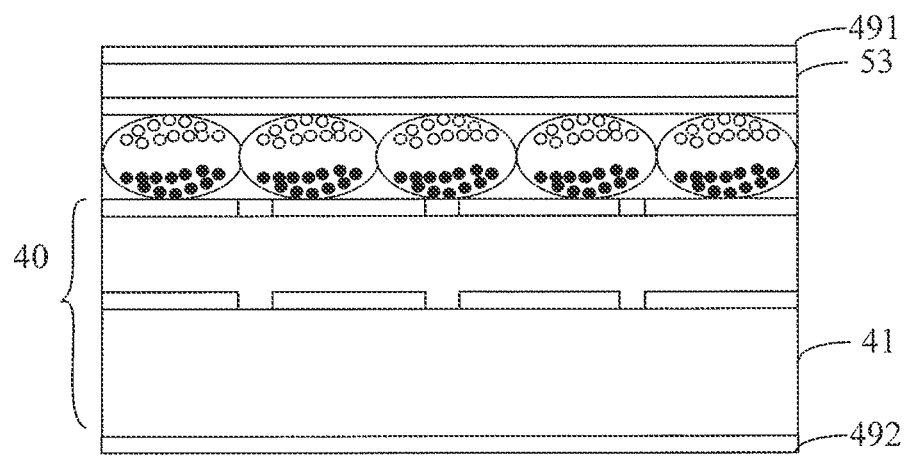
FIG. 11 is a schematic cross-sectional diagram of a pixel area of an electronic paper display panel according to a seventh embodiment of the present invention.

FIG. 11 is a schematic cross-sectional diagram of a pixel area of an electronic paper display panel according to a seventh specific embodiment. Referring to FIG. 11, a color filtering layer 491 is a CF plate which is located on the outer side of the second transparent substrate 53, and a color filtering layer 492 is also a CF plate which is located on the outer side of the first transparent substrate 41. In the electronic paper display panel provided by the embodiment, a color display may be realized on both display surfaces of the electronic paper display panel.

An Eighth Embodiment

Figure 12:
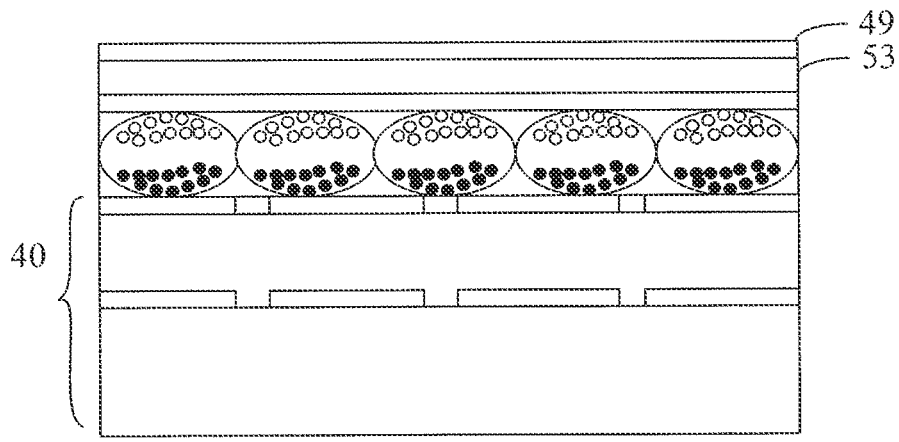
FIG. 12 is a schematic cross-sectional diagram of a pixel area of an electronic paper display panel according to an eighth embodiment of the present invention.

FIG. 12 is a schematic cross-sectional diagram of a pixel area of an electronic paper display panel according to an eighth specific embodiment. Referring to FIG. 12, the color filtering layer 49 is a CF plate which is located on the outer side of the second transparent substrate 53. In this way, a color display may be realized on the side of the second transparent substrate 53 and a black-and-white display may be realized on the side of the TFT array substrate 40 in the electronic paper display panel.

Based on the electronic paper display panel described above, the embodiments each include a TFT array substrate. All content for the TFT array substrate in the electronic paper display panel may be referred to when specific description of the electronic paper display panel is made and the TFT array substrate will not be described repeatedly herein.

Figure 13:
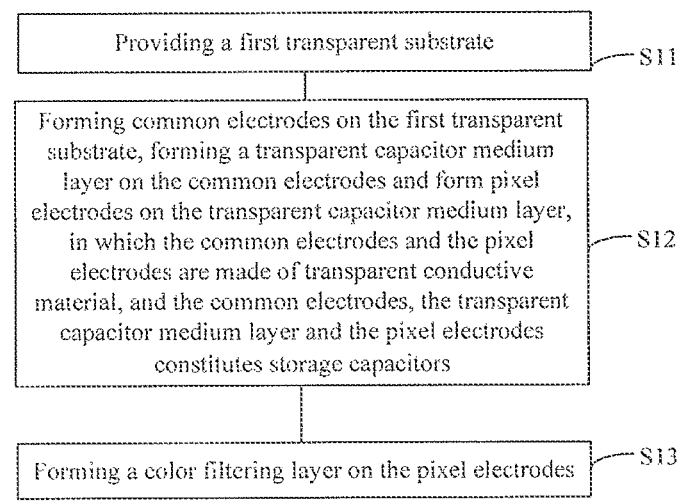
FIG. 13 is a schematic flow chart of a method for manufacturing a TFT array substrate according to another embodiment of the present invention.

FIG. 13 is a schematic flow chart of a method for manufacturing a TFT array substrate according to a first specific embodiment. Referring to FIG. 13, the method for manufacturing the TFT array substrate according to the first specific embodiment of the present invention include the following:

Step S11, providing a first transparent substrate.

Step S12, forming common electrodes on the first transparent substrate, forming a transparent capacitor medium layer on the common electrodes and forming pixel electrodes on the transparent capacitor medium layer. The common electrodes and the pixel electrodes are made of transparent conductive materials, and the common electrodes, the transparent capacitor medium layer and the pixel electrodes form storage capacitors.

Step 13, forming a color filtering layer on the pixel electrodes.

Figure 14:
FIG. 14 to FIG. 16 are schematic cross-sectional diagrams illustrating a method for manufacturing a TFT array substrate according to an embodiment of the present invention.

Referring to FIG. 13 and FIG. 14, step S11 is performed to provide the first transparent substrate 41.

Figure 15:
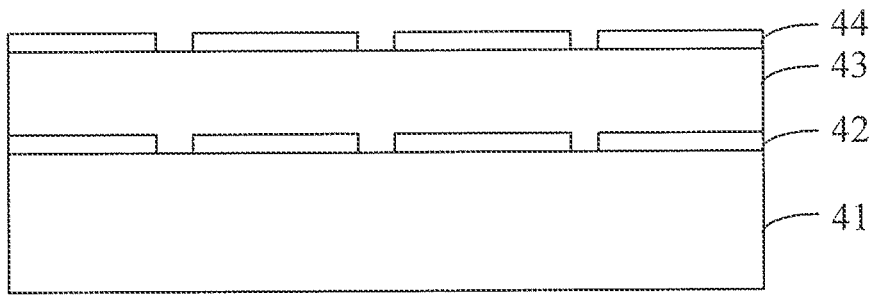

Referring to FIG. 13 and FIG. 15, step S12 is performed to form the common electrodes 42 on the first transparent substrate 41, form the transparent capacitor medium layer 43 on the common electrodes 42, and form the pixel electrodes 44 on the transparent capacitor medium layer 43. The materials of the common electrode 42 and the pixel electrode 44 are transparent conductive materials such as ITO. In the embodiment, the common electrodes 42 of respective pixels are arranged in an array, and are formed by: depositing a layer of ITO material on the transparent substrate 41, and then photoetching and etching the ITO material to form the common electrodes 42 arranged in array.

Figure 16:
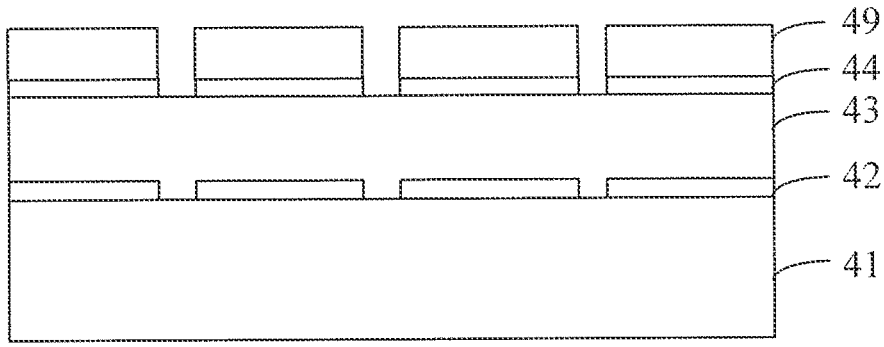

Referring to FIG. 13 and FIG. 16, step 13 is performed to form the color filtering layer 49 on the pixel electrodes 44. The color filtering layer 49 is the color resist layer including an R color resist, a G color resist and a B color resist. A method for forming the color resist layer includes: forming a first color resist layer by depositing and then exposing and developing the first color resist layer to form a first color resist; forming a second color resist layer by depositing and then exposing and developing the second color resist layer to form a second color resist; and forming a third color resist layer and then exposing and developing the third color resist layer to form a third color resist. Each of the first color resist, the second color resist and the third color resist is a respective one of the R color resist, the G color resist and the B color resist which form the color resist layer. The first color resist layer, the second color resist layer and the third color resist layer may be formed, for example, by coating, spin coating or drop coating. It is possible that the first color resist layer is the R color resist layer, the second color resist layer is the G color resist layer and the third color resist layer is the B color resist layer. Alternatively, it is also possible that the first color resist layer is the B color resist layer, the second color resist layer is the G color resist layer and the third color resist layer is the R color resist layer. The above are only examples, and each of the first color resist, the second color resist and the third color resist may be a respective one of the R color resist, the G color resist and the B color resist to compose a RGB color resist layer.

The method for manufacturing the TFT array substrate according to the specific embodiment further includes: forming an array of TFT switches on the transparent substrate. Referring to FIG. 5 and FIG. 6, the formed TFT switches and the storage capacitors are arranged on the transparent substrate in a direction parallel to the surface of the transparent substrate, and each storage capacitor is electrically connected with the corresponding TFT switch. The forming of the TFT switch array is well known to those skilled in the art and will not be described herein. The formed TFT switches may be the TFT switches according to the specific embodiment illustrated in FIG. 5 or FIG. 6.

The TFT array substrate formed in the above method corresponds to the TFT array substrate illustrated in FIG. 4.

In a method for manufacturing a TFT array substrate according to a third embodiment as illustrated in FIG. 7, the common electrodes 42 are formed on the first transparent substrate 41, the transparent capacitor medium layer 43 is formed on the common electrodes 42, the color filtering layer 49 is formed on the transparent capacitor medium layer 43 and the pixel electrodes 44 are formed on the color filtering layer 49. That is, the order for forming the pixel electrodes 44 is interchanged with the order for forming the color filtering layer 49. Other steps may be the same as that in the method for manufacturing the TFT array substrate according to the first specific embodiment.

In a method for manufacturing a TFT array substrate according to the fourth embodiment as illustrated in FIG. 8, after the pixel electrodes 44 and the color filtering layer 49 are formed, the planar layer 61 is formed to cover the pixel electrodes 44 and the color filtering layer 49. The planar layer 61 is formed by chemical vapor deposition, and then a planarization is performed on the planar layer 61. Other steps may be the same as that in the method for manufacturing the TFT array substrate according to the first specific embodiment.

In a method for manufacturing the TFT array substrate according to the fifth embodiment as illustrated in FIG. 9, after the pixel electrodes 44 and the color filtering layer 49 are formed, the planar layer 61 is formed to cover the pixel electrodes 44 and the color filtering layer 49. The planar layer 61 is formed by chemical vapor deposition, and then a planarization is performed on the planar layer 61. Other steps may be the same as that in the method for manufacturing the TFT array substrate according to the first specific embodiment.

In the method for manufacturing the TFT array substrate according to the sixth embodiment as illustrated in FIG. 10, after a color filtering layer 49 is formed, the planar layer 61 is formed to cover the color filtering layer 49, and then the pixel electrodes 44 are formed on the planar layer 61. The planar layer 61 is formed by chemical vapor deposition, and then a planarization is performed on the planar layer 61. That is, as compared with the second embodiment, the planar layer 61 is formed between the pixel electrodes 44 and the color filtering layer 49. Other steps may be the same as that in the method for manufacturing the TFT array substrate according to the first specific embodiment.

It should be noted that, the content described for the structure of the TFT array substrate may be referred to when the description of the method for manufacturing the TFT array substrate is made. The TFT array substrate has advantages of thin thickness, low cost and relatively simple manufacturing method.

Figure 17:
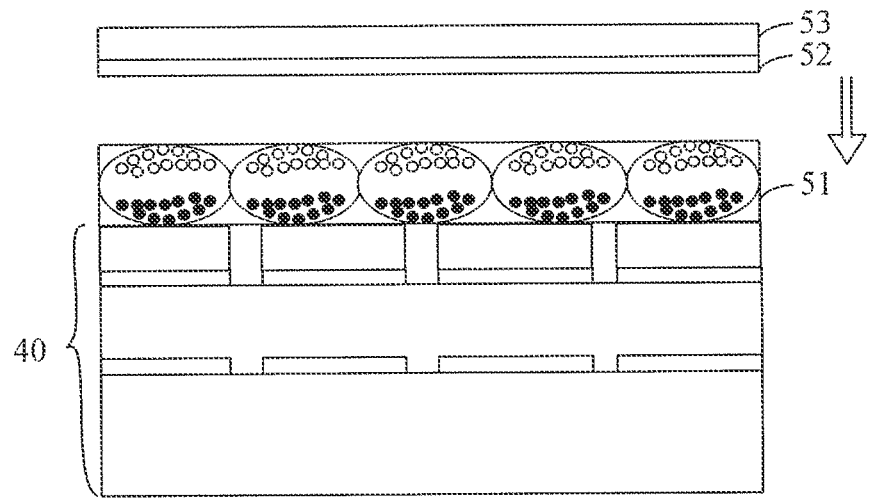
FIG. 17 is a schematic diagram in which a TFT array substrate, a second transparent substrate and an electronic paper film are combined according to a first embodiment.

Referring to FIG. 17, a method for manufacturing an electronic paper display panel may include the following.

Providing the TFT array substrate 40, where the TFT array substrate 40 illustrated in FIG. 17 is the TFT array substrate according to the first embodiment as illustrated in FIG. 4. Accordingly, the color filtering layer is a color resist layer which is formed in the TFT array substrate. The TFT array substrate may, for example, be any one of the TFT array substrates according to other embodiments described above.

Providing an electronic paper film 51 and adhering the electronic paper film 51 on the TFT array substrate 40.

Providing a second transparent substrate 53 on which a transparent electrode 52 is deposited.

Adhering the second transparent substrate 53 on the electronic paper film in a way that the transparent electrode 52 faces towards the electronic paper film.

In other words, in the embodiment, firstly the electronic paper film 51 is adhered to the TFT array substrate 40, then the combination of the second transparent substrate 53 and the transparent electrode 52 is adhered to the electronic paper film 51.

Figure 18:
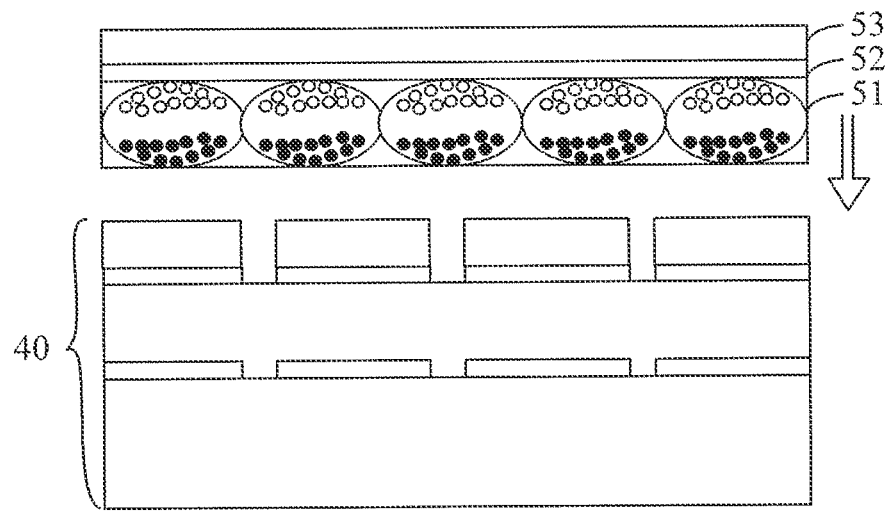
FIG. 18 is a schematic diagram in which a TFT array substrate, a second transparent substrate and an electronic paper film are combined according to a second embodiment.

Referring to FIG. 18, another method for manufacturing an electronic paper display panel includes the following.

Providing the TFT array substrate 40, where the TFT array substrate 40 illustrated in FIG. 18 may be the TFT array substrate according to the first embodiment as illustrated in FIG. 4. The color filtering layer may be a color resist layer which is formed in the TFT array substrate. The TFT array substrate may be any one of the TFT array substrates according to other embodiments described above.

Providing a second transparent substrate 53 on which a transparent electrode 52 is deposited.

Providing an electronic paper film 51 and adhering the electronic paper film 51 on the transparent electrode 52.

Adhering the second transparent substrate 53 to the TFT array substrate 40 in a way that the electronic paper film faces towards the TFT array substrate 40.

In other words, in the embodiment, the second transparent substrate 53, the transparent electrode 52 and the electronic paper film 51 are firstly combined together and then combined with the TFT array substrate.

According to the method for manufacturing an electronic paper display panel, the precision requirement during adhering is reduced. Typically, when a CF plate is adhered to a TFT array substrate in the manufacture of the electronic paper display panel, a fine alignment in pixel level is used to align an R color filtering area with an R pixel area, a G color filtering area with a G pixel area, and a B color filtering area with a B pixel area. A small deviation during the alignment process may result in a misalignment of the CF plate and the TFT array substrate. The stringent requirement for the alignment precision of the process, however, may be difficult to be met by the aligning and adhering machine.

For the TFT array substrate used in the method for manufacturing an electronic paper display panel, the color resist layer is formed in the TFT array substrate by coating materials. Fine alignment in pixel level is unnecessary when the TFT array substrate, the electronic paper film and the second transparent substrate are combined, thus the precision requirement during the adhering is greatly reduced. The process difficulty is reduced and the yield is improved.

Though the present invention is disclosed by way of preferred embodiments as described above, those embodiments are not intended to limit the present invention. Possible variations and changes to the technical solutions of the present invention may be made by those skilled in the art based on the methods and the technical contents disclosed above without departing from the spirit and the scope of the present invention. Therefore, changes, equivalent alternations and modifications made to the above embodiments according to the technical principles of the present invention, which do not depart from the technical solutions of the present invention, fall within the scope of protection of the present invention.

What is claimed is:

1. A Thin-Film Transistor (TFT) array substrate configured of double-sided display, the TFT array substrate comprising:
a first transparent substrate; an array of storage capacitors disposed on the first transparent substrate, wherein each of the storage capacitors comprises:
a common electrode disposed on the first transparent substrate,
a transparent capacitor medium layer disposed on the common electrode,
and a pixel electrode disposed on the transparent capacitor medium layer,
wherein both the common electrodes and the pixel electrodes are transparent and conductive; and an electronic paper film disposed on the pixel electrode, wherein the electronic paper film is configured to display images visible through the first transparent substrate; and wherein the electronic paper film is configured to display images visible from the electronic paper film side of the TFT substrate.

2. The Thin-Film Transistor array substrate according to claim 1, further comprising a color filter plate, located on the first transparent substrate.

3. The Thin-Film Transistor array substrate according to claim 2, wherein the color filter plate is an RGB color filter plate.

4. The Thin-Film Transistor array substrate according to claim 1, further comprising a color resist layer, located on the first transparent substrate.

5. The Thin-Film Transistor array substrate according to claim 4, wherein the color resist layer comprises an R color resist, a G color resist and a B color resist.

6. The Thin-Film Transistor array substrate according to claim 4, wherein the color resist layer is located on the pixel electrodes.

7. The Thin-Film Transistor array substrate according to claim 6, further comprising a planar layer, covering the color resist layer.

8. The Thin-Film Transistor array substrate according to claim 4, wherein the color resist layer is located between the transparent capacitor medium layer and the pixel electrodes.

9. The Thin-Film Transistor array substrate according to claim 8, further comprising a planar layer, covering the color resist layer.

10. The Thin-Film Transistor array substrate according to claim 8, further comprising a planar layer, covering the pixel electrodes.

11. An electronic paper display panel configured of double-sided display, the electronic paper display panel comprising:
a Thin-Film Transistor array substrate comprising:
a first transparent substrate, and
an array of storage capacitors disposed on the first transparent substrate,
wherein each of the storage capacitors comprises:
a common electrode disposed on the first transparent substrate,
a transparent capacitor medium layer disposed on the common electrode, and a pixel electrode disposed on the transparent capacitor medium layer, wherein both the common electrodes and the pixel electrodes are transparent and conductive;
an electronic paper film, disposed on the Thin-Film Transistor array substrate;
a transparent electrode, disposed on the electronic paper film; and a second transparent substrate, disposed on the transparent electrode, wherein the electronic paper film is configured to display images visible through the first transparent substrate, and wherein the electronic paper film is configured to display images visible through the second transparent substrate.

12. The electronic paper display panel according to claim 11, wherein the transparent electrode comprises Indium Tin Oxide.

13. The electronic paper display panel according to claim 11, wherein the second transparent substrate comprises at least one of Polyethylene terephthalate, glass, and plastic.

14. The electronic paper display panel according to claim 11, wherein the electronic paper film comprises a microcapsule film comprising multiple microcapsules.

15. The electronic paper display panel according to claim 14, wherein each of the microcapsules comprises black particles, white particles, and a transparent liquid.

16. The electronic paper display panel according to claim 14, wherein each of the microcapsules comprises white particles and a black opaque liquid.

17. The electronic paper display panel according to claim 14, wherein each of the microcapsules comprises black particles and a white opaque liquid.

18. A method for manufacturing an electronic paper display panel configured of double-sided display, the method comprising:
  providing a Thin-Film Transistor array substrate comprising:
    a first transparent substrate,
    an array of storage capacitors disposed on the first transparent substrate, wherein each of the storage capacitors comprises:
      a common electrode disposed on the first transparent substrate,
      a transparent capacitor medium layer disposed on the common electrode,
      and a pixel electrode disposed on the transparent capacitor medium layer,
      wherein the common electrodes and the pixel electrodes are transparent and conductive; and a color resist layer, disposed on the first transparent substrate; providing an electronic paper film and adhering the electronic paper film on the Thin-Film Transistor array substrate;
  providing a second transparent substrate, on which a transparent electrode is deposited; and adhering the second transparent substrate on the electronic paper film such that the transparent electrode faces towards the electronic paper film,
  wherein the electronic paper film is configured to display images visible through the first transparent substrate, and wherein the electronic paper film is configured to display images visible through the second transparent substrate.

19. A method for manufacturing an electronic paper display panel configured of double-sided display, the method comprising:
  providing a Thin-Film Transistor array substrate comprising:
    a first transparent substrate,
    an array of storage capacitors disposed on the first transparent substrate,
    wherein each of the storage capacitors comprises:
      a common electrode disposed on the first transparent substrate,
      a transparent capacitor medium layer disposed on the common deposited;
      electrode, and a pixel electrode disposed on the transparent capacitor medium layer, wherein the common electrodes and the pixel electrodes are transparent and conductive; and a color resist layer, disposed on the first transparent substrate;
  providing a second transparent substrate, on which a transparent electrode is providing an electronic paper film and adhering the electronic paper film on the transparent electrode; and adhering the second transparent substrate on the Thin-Film Transistor array substrate such that the electronic paper film faces towards the Thin-Film Transistor array substrate,
  wherein the electronic paper film is configured to display images visible through the first transparent substrate, and
  wherein the electronic paper film is configured to display images visible through the second transparent substrate.

* * * * *